(12) United States Patent
Niino et al.

(10) Patent No.: US 7,859,001 B2
(45) Date of Patent: Dec. 28, 2010

(54) SEMICONDUCTOR LIGHT EMITTING APPARATUS

(75) Inventors: Wakako Niino, Tokyo (JP); Masami Kumei, Tokyo (JP); Toshimi Kamikawa, Tokyo (JP); Takashi Ebisutani, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 5 days.

(21) Appl. No.: 12/187,570

(22) Filed: Aug. 7, 2008

(65) Prior Publication Data

US 2009/0039369 A1 Feb. 12, 2009

(30) Foreign Application Priority Data

Aug. 7, 2007 (JP) ............................. 2007-205597

(51) Int. Cl.
*H01L 33/00* (2010.01)

(52) U.S. Cl. ............................. 257/98; 257/79; 257/80; 257/81; 257/82; 257/99; 257/100; 257/918; 257/E51.018; 257/E51.022; 257/E33.001; 257/E33.054; 257/E25.028; 257/E25.032; 257/E33.055

(58) Field of Classification Search .................. 257/13, 257/79–103, 918, E51.018, E51.022, E33.001, 257/98, E33.055

See application file for complete search history.

(56) References Cited

U.S. PATENT DOCUMENTS 6,791,116 B2* 9/2004 Takahashi et al. ............. 257/79

| | | | | |
|---|---|---|---|---|
| 2005/0221519 A1* | 10/2005 | Leung et al. | ................... | 438/27 |
| 2006/0043407 A1* | 3/2006 | Okazaki | ....................... | 257/100 |
| 2006/0054913 A1* | 3/2006 | Hadame et al. | ................ | 257/99 |
| 2008/0012036 A1* | 1/2008 | Loh et al. | ....................... | 257/99 |
| 2008/0079182 A1* | 4/2008 | Thompson et al. | ........... | 264/1.9 |

FOREIGN PATENT DOCUMENTS

JP           2002033520           1/2002

* cited by examiner

*Primary Examiner*—Wael M Fahmy
*Assistant Examiner*—Marc Armand
(74) *Attorney, Agent, or Firm*—Kenealy Vaidya LLP

(57) ABSTRACT

A semiconductor light emitting apparatus can include a housing filled with a wavelength conversion material-containing resin material which seals a semiconductor light emitting device inside the recess of the housing. A transparent resin material can be charged on the wavelength conversion material-containing resin material, and can be configured to prevent the resin materials from being detached from each other or from other portions, such as a housing. Furthermore, such a semiconductor light emitting apparatus can emit light with less color unevenness. The housing can include a first recessed portion and a second recessed portion. The second recessed portion can have a larger diameter than the first recessed portion so as to form a stepped area at the boundary therebetween. The first recessed portion is filled with the wavelength conversion material-containing resin material as a first resin. The first resin extends along from an inner surface of the first recessed portion up to an inner surface of the second recessed portion to cover the inner surface of the second recessed portion. Accordingly, the first resin is recessed at its center area toward the semiconductor light emitting device to form a curved upper surface, and the second resin on the first resin is not in contact with the housing.

17 Claims, 3 Drawing Sheets

SEMICONDUCTOR LIGHT EMITTING APPARATUS

This application claims the priority benefit under 35 U.S.C. §119 of Japanese Patent Application No. 2007-205597 filed on Aug. 7, 2007, which is hereby incorporated in its entirety by reference.

BACKGROUND

1. Technical Field

The presently disclosed subject matter relates to semiconductor light emitting apparatuses, and in particular, to a semiconductor light emitting apparatus that uses a semiconductor light emitting device and a wavelength converting material such as a phosphor in combination.

2. Description of the Related Art

Semiconductor light emitting apparatuses have been conventionally known that use a semiconductor light emitting device and a wavelength converting material such as a phosphor in combination in order to emit light in which color (tone) is changed from the original color (tone) originating from the semiconductor light emitting device to a second different color (tone). One example of such a semiconductor light emitting apparatus is shown in FIG. 1.

This type of semiconductor light emitting apparatus can include a resin housing 52 with which a pair of leads 50 and 51 are integrated. Inside the resin housing 52 a first recessed portion 54 is formed. Above the first recessed portion 54 a second recessed portion 53 with a larger diameter than that of the first recessed portion 54 is continuously formed.

A semiconductor light emitting device 55 can be mounted on and/or adjacent to the bottom of the first recessed portion 54. Not-shown electrodes of the semiconductor light emitting device 55 are electrically connected to the respective leads 50 and 51 by means of bonding wires 56 and 57.

A transparent resin material is mixed with a particular wavelength converting material such as a particular phosphor to prepare a phosphor-containing resin 58, which is charged into the first recessed portion 54 to resin-seal the semiconductor light emitting device 55. On the phosphor-containing resin 58 and inside the second recessed portion 53 another transparent resin material 59 is charged, thereby completing the semiconductor light emitting apparatus (see, for example, Japanese Patent Application Laid-Open No. 2002-33520).

The semiconductor light emitting apparatus configured as described above is referred to as a surface mount type and is used as a light source for use in a portable handy terminal or the like.

This type of semiconductor light emitting apparatus can be configured in such a manner that a soft resin material is used as the transparent resin material for constituting the phosphor-containing resin 58 which is charged into the first recessed portion 54 to resin-seal the semiconductor light emitting device 55, and a hard resin material is used as the transparent resin material 59 which is charged into the second recessed portion 53 on the phosphor-containing resin 58. However, the following problems may arise in this configuration.

When the environmental test (heat cycle test) is performed on the semiconductor light emitting apparatus configured as described above, the phosphor-containing resin 58 can repeatedly expand and contract in accordance with the temperature change during the heat cycle. When the phosphor-containing resin 58 expands, an external force may be applied to the transparent resin material 59 which forms the boundary between the phosphor-containing resin 58. As a result, the transparent resin material 59 may become detached and can be peeled from the contact area with the stepped area 60 where the boundary between the phosphor-containing resin 58 and the transparent resin material 59 (between the first and second recessed portions 54 and 53) is formed, thereby easily forming a crack 61 at that area and adjacent areas.

This phenomenon may occur even during the normal operation conditions. For example, it may occur due to the repeated turning-on and turning-off of the semiconductor light emitting device which leads to repeated generation of heat and cooling of the semiconductor light emitting device.

SUMMARY

The presently disclosed subject matter was devised in view of these and other problems, features and characteristics and in association with the conventional art. According to an aspect of the presently disclosed subject matter, a semiconductor light emitting apparatus can be configured to help prevent the detachment (peeling-off) of used resin materials at their boundary with each other or with other members, while the resin materials are filled into a recessed portion of its housing. Accordingly, a semiconductor light emitting apparatus is disclosed which can include a housing filled with a wavelength conversion material-containing resin material which seals a semiconductor light emitting device inside the recess of the housing and a transparent resin material charged inside the recessed portion on the wavelength conversion material-containing resin material, and which can prevent the resin materials from being detached and/or peeled from each other or from other portions such as a housing. Furthermore, such a semiconductor light emitting apparatus can emit light with less color unevenness.

According to another aspect of the presently disclosed subject matter, a semiconductor light emitting apparatus can include: a housing having an inner space provided thereinside; a semiconductor light emitting device installed in the inner space of the housing; and a resin portion with which the inner space of the housing is filled. Here, the inner space of the housing can include a first recessed portion having a bottom surface and a second recessed portion having an opening. The semiconductor light emitting device can be mounted on and/or adjacent to the bottom surface of the first recessed portion. The second recessed portion can be continuously formed above the first recessed portion. The upper portion of the first recessed portion and the lower portion of the second recessed portion can form a boundary portion, and the second recessed portion can be formed larger in width than the first recessed portion to form a stepped area at the boundary portion. The resin portion can include a first resin and a second resin. The first resin can be formed of a transparent resin material mixed with a wavelength converting material such as a phosphor, and can be charged into the first recessed portion to seal the semiconductor light emitting device. The second resin can be formed of a transparent resin material and charged above the first resin. The first resin can be provided such that the first resin extends along from an inner surface of the first recessed portion up to an inner surface of the second recessed portion to cover the inner surface of the second recessed portion. The first resin can be recessed at its center area toward the semiconductor light emitting device to form a curved upper surface.

In the semiconductor light emitting apparatus configured as described above, the first resin can have a lowermost level of the curved upper surface positioned nearer the semiconductor light emitting device than a level of the stepped area.

In the semiconductor light emitting apparatus configured as described above, the second resin can have a curved upper surface recessed toward the semiconductor light emitting device, with an uppermost level of the curved surface of the second resin being lower than the uppermost edge of the outer periphery of the second recessed portion of the housing.

Alternatively, in the semiconductor light emitting apparatus configured as described above, the second resin can have a curved convex upper surface, and preferably the uppermost level of the curved convex upper surface of the second resin can be lower than the uppermost edge of the outer periphery of the second recessed portion of the housing.

In the semiconductor light emitting apparatus configured as described above, the second resin can have a predetermined hardness harder than that of the transparent resin material constituting the first resin.

In the semiconductor light emitting apparatus configured as described above, the transparent resin material constituting the first resin can have a predetermined elasticity, and is softer than the second resin.

In the semiconductor light emitting apparatus configured as described above, the second resin can have a refractive index lower than that of the transparent resin material constituting the first resin.

In the semiconductor light emitting apparatus configured as described above, the first recessed portion of the housing can be provided with a high reflective film on the inner surface thereof and a corrosion resistance film on the outer surface thereof.

In the semiconductor light emitting apparatus configured as described above, the high reflective film can be formed of a film selected from the group consisting of silver, silver alloys, and aluminum, and the corrosion resistance film can be formed of gold.

In the semiconductor light emitting apparatus configured as described above, the second resin can also contain a wavelength converting material in a concentration less than that in the first resin.

The semiconductor light emitting apparatus of the presently disclosed subject matter can be configured to include a housing having an inner space composed of a first recessed portion and a second recessed portion provided above the first recessed portion, in which a semiconductor light emitting device is mounted on the bottom surface of the first recessed portion. A first resin composed of a transparent resin material and a wavelength converting material such as a phosphor can be charged into the first recessed portion to seal the semiconductor light emitting device. Furthermore, the first resin can be provided such that the first resin extends along from an inner surface of the first recessed portion up to an inner surface of the second recessed portion to cover the inner surface of the second recessed portion. The upper surface of the first resin can be recessed at its center area toward the semiconductor light emitting device to form a curved upper surface. Then, the second resin is charged onto the thus formed first resin.

As a result, the first resin can cover the entire surface of the inner space including the first recessed portion and the second recessed portion of the housing, thereby preventing the second resin formed on the first resin from being in contact with the inner surface of the housing. According to this configuration, the resin portion can be prevented from being detached and/or peeled from the housing, and a semiconductor light emitting apparatus with less color unevenness can be achieved.

BRIEF DESCRIPTION OF THE DRAWINGS

These and other characteristics, features, and advantages of the presently disclosed subject matter will become clear from the following description with reference to the accompanying drawings, wherein.

DETAILED DESCRIPTION OF EXEMPLARY EMBODIMENTS

A description will now be made below with respect to examples of semiconductor light emitting apparatuses of the presently disclosed subject matter with reference to the accompanying drawings and in accordance with exemplary embodiments.

Figure 1:
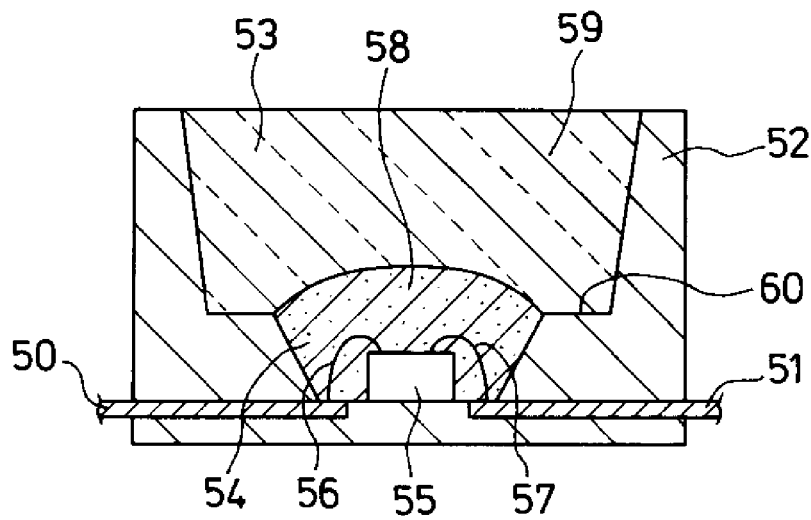
FIG. 1 is a cross sectional view showing one conventional example of a semiconductor light emitting apparatus.
Figure 2:
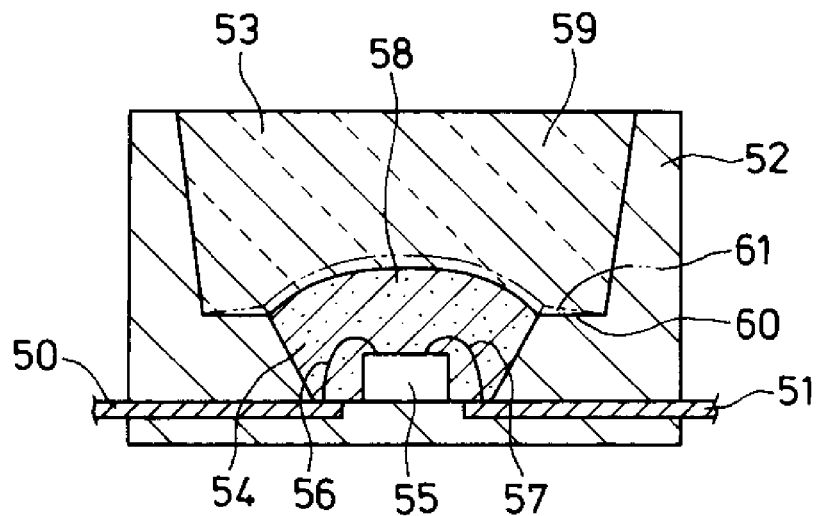
FIG. 2 is a schematic diagram showing a crack in the conventional semiconductor light emitting apparatus of FIG. 1.
Figure 3:
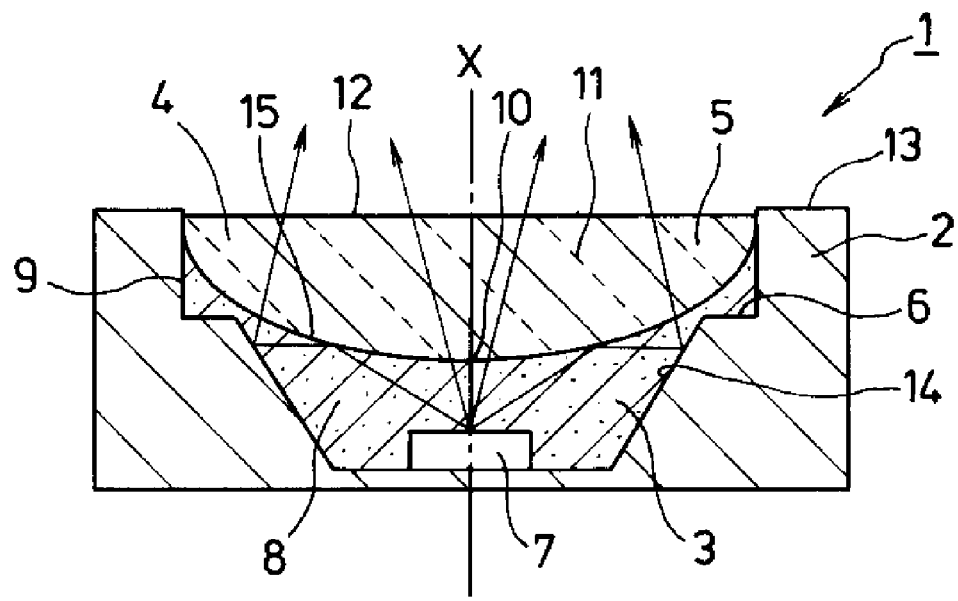
FIG. 3 is a cross sectional view showing one exemplary embodiment of a semiconductor light emitting apparatus made in accordance with principles of the presently disclosed subject matter.

FIG. 3 is a cross sectional view showing a first exemplary embodiment of a semiconductor light emitting apparatus made in accordance with principles of the presently disclosed subject matter. The semiconductor light emitting apparatus 1 can have a housing 2 made of a white resin material which has a particular reflectivity. Inside the housing 2 an inner space can be formed, including a first recessed portion 3 and a second recessed portion 5 continuously formed above the first recessed portion 3 and having an opening 4. The upper portion of the first recessed portion 3 and the lower portion of the second recessed portion 5 can form a boundary portion, and the second recessed portion 5 can be formed larger in width than the first recessed portion 3 to form a stepped area 6 at the boundary portion.

A semiconductor light emitting device 7 can be mounted on the bottom of the first recessed portion 3. A first resin 8 can be formed of a transparent resin material mixed with a wavelength converting material such as a particular phosphor, and is charged into the first recessed portion 3 to seal the semiconductor light emitting device 7. The first resin 8 can be disposed such that the first resin 8 extends along from an inner surface 14 of the first recessed portion 3 up to an inner surface 9 of the second recessed portion 5 to cover the inner surface 9 of the second recessed portion 5. The upper surface 15 of the first resin 8 can be recessed toward the semiconductor light emitting device 7 to form a curved upper surface 15. The curved upper surface 15 of the first resin 8 can have a lowermost level 10 (at the center area near the optical axis X of the below-positioned semiconductor light emitting device 7)

positioned nearer the semiconductor light emitting device 7 than the level of the stepped area 6 where the boundary between the first recessed portion 3 and the second recessed portion 5 is positioned.

A second resin 11 can be formed of a transparent resin material and charged above the first resin 8 to form a boundary with the first resin 8. As a result, the resin portion can be composed of the first resin 8 and the second resin 11. In the present exemplary embodiment, the upper surface 12 of the second resin 11 can be formed to have a planar surface to be flush with the opening edge 13 of the housing 2. According to this configuration, the second resin 11 is not in contact with both the inner surface 14 of the first recessed portion 3 and the inner surface 9 of the second recessed portion 5.

In the semiconductor light emitting apparatus 1 configured as described above, the first resin 8 may expand and contract due to the environmental temperature change or the temperature change by the repeated turning-on and -off of the semiconductor light emitting device 7. Even in such a case, since the second resin 11 which forms the boundary with the first resin 8 is not in contact with both the inner surface 14 of the first recessed portion 3 and the inner surface 9 of the second recessed portion 5, the second resin 11 receives an external force due to the expansion and contraction of the first resin 8 only at the contact area with the first resin 8, but it does not transfer the force to other members, such as the housing 2. Accordingly, the second resin 11 is not detached and/or peeled from the housing 2 irrespective of the hardness relationship between the different transparent resin materials constituting the first resin 8 and the second resin 11.

In the above configuration, the hardness relationship between the transparent resin material constituting the first resin 8 and the transparent resin material of the second resin 11 can be characterized according to the following two exemplary cases:

(1) the transparent resin material constituting the first resin 8 and the transparent resin material of the second resin 11 each have a particular elasticity (for example, a combination of silicone resins selected from the group consisting of (or including) soft elastomers (having a superior stress relief property with a low-to-medium hardness (for example, JIS Type A hardness of more than 50)), gels having the same performance as, or similar to, the previous soft elastomers, hard elastomers (serving as a surface layer without stickiness with a JIS Type A hardness of more than 50), high hardness resins with a Shore D hardness of from 60 to 70, and low hardness resins with a Shore D hardness of from 30 to 40); and (2) the transparent resin material constituting the first resin 8 has a particular elasticity, and the transparent resin material of the second resin 11 has a particular hardness (for example, an exemplary combination of a soft elastomer (having a superior stress relief property with a low-to-medium hardness (for example, JIS Type A hardness of more than 50)) or a gel having the same performance as, or similar to, the previous soft elastomer serving as the first resin 8 and a high hardness epoxy resin with a Shore D hardness of 60 or more serving as the second resin 11).

In some cases, if a high power semiconductor light emitting device is used as the device 7, the semiconductor light emitting device 7 may generate a relatively large amount of heat during operation. Even in these cases, the combination of the resin materials (for example, silicone resins) as described in the above item (1) can suppress the deterioration of the transparent resin material constituting the sealing resin for the semiconductor light emitting device 7, thereby providing a semiconductor light emitting apparatus 1 with high reliable optical performances (including stable luminous intensity and less color change).

Furthermore, if the combination of the resin materials as described in the above item (2) is adopted, it is possible to suppress the generation of stress due to heat generation within the sealing resin for sealing the semiconductor light emitting device 7. Accordingly, this can also prevent crack generation, thereby improving the reliability of the semiconductor light emitting apparatus 1. In addition to this, dust and foreign matters can be prevented from adhering onto the outermost surface of the apparatus because the outermost surface is formed of the second resin 8 which has a particular hardness suitable for preventing dust and foreign matter adhesion.

Furthermore, in both of the cases as described in the items (1) and (2), the transparent resin material constituting the first resin 8 includes a resin having a particular elasticity as well as a particular softness. In this case, not-shown bonding wires for electrically connecting the electrodes of the semiconductor light emitting device 7 to the electrodes provided in the housing 2 can be prevented from being detached from the electrodes or being cut due to the repeated thermal expansion and contraction of the resin for sealing the device 7.

The present inventors have also examined the optical action with regard to the relationship between the transparent resin material constituting the first resin 8 and the transparent resin material of the second resin 11. As a result, the present inventors have found that it is desirable to design the transparent resins such that the transparent resin material constituting the first resin 8 (for sealing the semiconductor light emitting device 7) has a larger refractive index than that of the transparent resin material of the second resin 11 located above the first resin 8. This can make the refractive index of the sealing resin which forms the boundary with the light emitting surface of the semiconductor light emitting device 7 closer to the refractive index of the crystalline material constituting the semiconductor light emitting device 7, thereby increasing the light extraction efficiency from the semiconductor light emitting device 7.

Furthermore, in the above configuration, some of the light rays which are emitted at an angle from the semiconductor light emitting device 7 with respect to the optical axis X of the device 7 can reach the boundary between the first resin 8 and the second resin 11 and enter the boundary at a larger angle than the critical angle, thereby being reflected by the boundary face. Then, the light rays can reach the inner surface 14 of the first recessed portion 3 of the housing 2 as shown in FIG. 3. The light rays are further reflected by the inner surface 14 to enter the second resin 11 and be emitted to the outside.

Accordingly, the light rays emitted from the device 7 in directions other than along the direction of the optical axis X can be re-directed in the illumination direction (along the optical axis X) effectively, thereby increasing the light extraction efficiency. It should be noted that the transparent resin material constituting the first resin 8 may have a refractive index of 1.5 or more, and that the transparent resin material of the second resin 11 may have a refractive index of around 1.4. A proper selection of the kinds of transparent resin material can achieve a semiconductor light emitting apparatus 1 with good optical characteristics.

Examples of the transparent resin materials constituting the first resin 8 include, but are not limited to, elastomers which are available from Dow Corning Toray Co., Ltd. and have a superior stress relief property with a low-to-medium hardness (for example, JIS Type A hardness of more than 50) and a refractive index of from 1.5 to 1.55, such as JCR6175. Examples of the transparent resin materials of the second resin 11 include, but are not limited to, hard elastomers which serve as a surface layer without stickiness with a JIS Type A hardness of more than 50 and a refractive index of from 1.4 to 1.45, such as OE-6336, EG-6301, OE-6351 and the like.

It should be noted that means for electrically connecting the semiconductor light emitting device, such as leads and wires, are omitted in the drawings (FIGS. 3 to 6) as a matter of convenience.

Figure 4:
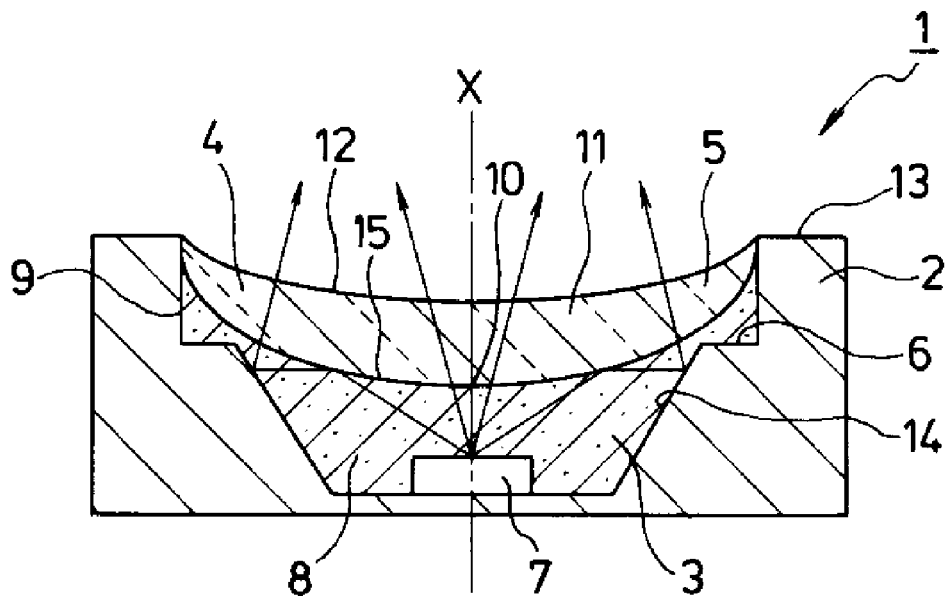
FIG. 4 is a cross sectional view showing another exemplary embodiment of a semiconductor light emitting apparatus made in accordance with principles of the presently disclosed subject matter.

FIG. 4 is a cross sectional view showing a semiconductor light emitting apparatus in accordance with a second exemplary embodiment of the presently disclosed subject matter. The second exemplary embodiment is different from the first exemplary embodiment at least in that the upper surface 12 of the second resin 11 charged on the upper surface 15 of the first resin 8 has a convex surface facing toward the semiconductor light emitting device 7. The other configuration thereof can be the same as that of the first exemplary embodiment.

The upper surface 12 of the second resin 11 is concave facing away from the semiconductor light emitting device and is located lower than the opening edge 13 of the housing 2. This configuration can protect the surface 12 of the second resin 11 by using the opening edge 13 of the housing 2 to block other parts, such as a substrate, from accidentally hitting the semiconductor light emitting apparatus 1 during its mounting operation, thereby maintaining a non-defective surface 12 of the second resin 11. Accordingly, it is possible to secure favorable optical characteristics for the semiconductor light emitting apparatus 1.

Figure 5:
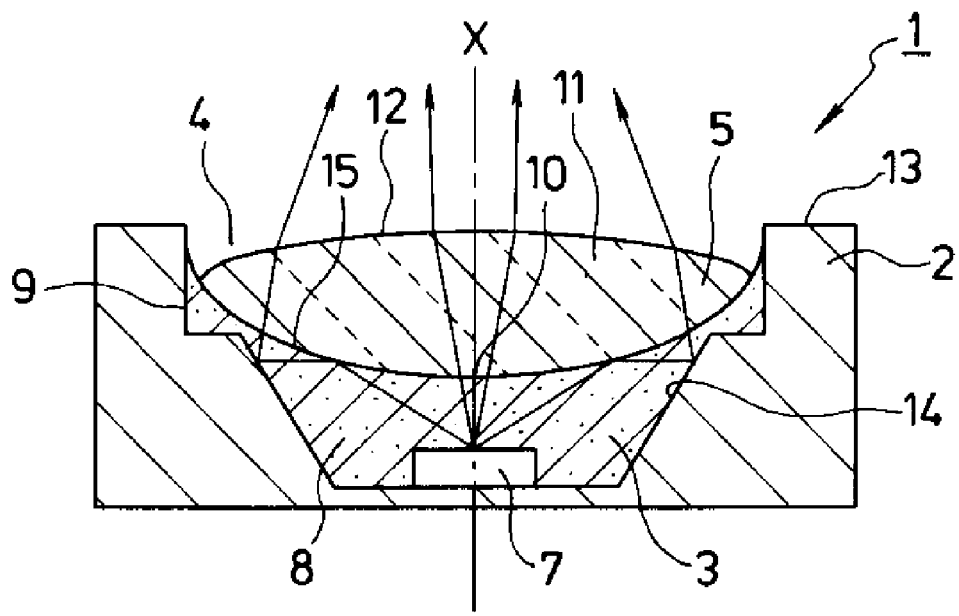
FIG. 5 is a cross sectional view showing still another exemplary embodiment of a semiconductor light emitting apparatus made in accordance with principles of the presently disclosed subject matter.

FIG. 5 is a cross sectional view showing a semiconductor light emitting apparatus in accordance with the third exemplary embodiment of the presently disclosed subject matter. The third exemplary embodiment is different from the second exemplary embodiment at least in that the upper surface 12 of the second resin 11 charged on the upper surface 15 of the first resin 8 has a convex surface facing in a direction opposite to the semiconductor light emitting device 7. The other configuration thereof can be the same as that of the first exemplary embodiment.

The upper surface 12 of the second resin 11 can serve as a lens or similar means for converging the light rays emitted from the device 7 and which are guided through the second resin 11. This can increase the luminous intensity within a predetermined area of light emitted from the semiconductor light emitting apparatus 1.

In the first to third exemplary embodiments, the housing 2 can be formed of a white resin material having a particular reflectivity, although the presently disclosed subject matter is not limited to this configuration. In order to enhance the reflectivity, the inner surface 14 of the first recessed portion 3 can be provided with a high reflective layer, for example, made of a metal film. The metal film can be one selected from the group consisting of (or including) silver, silver alloys, and aluminum which each have a high reflectivity with respect to the light rays having visible wavelengths.

In the first to third exemplary embodiments, the housing 2 is not necessarily formed of a resin material, but may be formed of a metal material, a ceramic material, or a combination of metal and ceramics, or similar materials. When the housing 2 is formed of a metal material, a corrosion resistance film may be further provided on the outer surface of the housing 2. Examples of the corrosion resistance film include Au film and the like. Furthermore, a corrosion resistance film and a high reflective layer of a metal film for enhancing its reflectivity can be provided at the inner surfaces of the first recessed portion 3 and the second recessed portion 5. The metal film can be one selected from the group consisting of (or including) silver, silver alloys, and aluminum which each have a high reflectivity with respect to light rays within the visible wavelength spectrum. Examples of ceramics include AlN, $Al_2O_3$, and the like which are commonly utilized. A white material can be used having a high reflectivity with respect to the visible wavelength light rays.

The second resin 11 can also contain a wavelength converting material as in the case of the first resin 8 for sealing the semiconductor light emitting device 7. In this case, the concentration of the phosphor in the second resin 11 is less than that in the first resin 8. This configuration can reduce the color unevenness of radiated light rays from the semiconductor light emitting apparatus 1.

Figure 6:
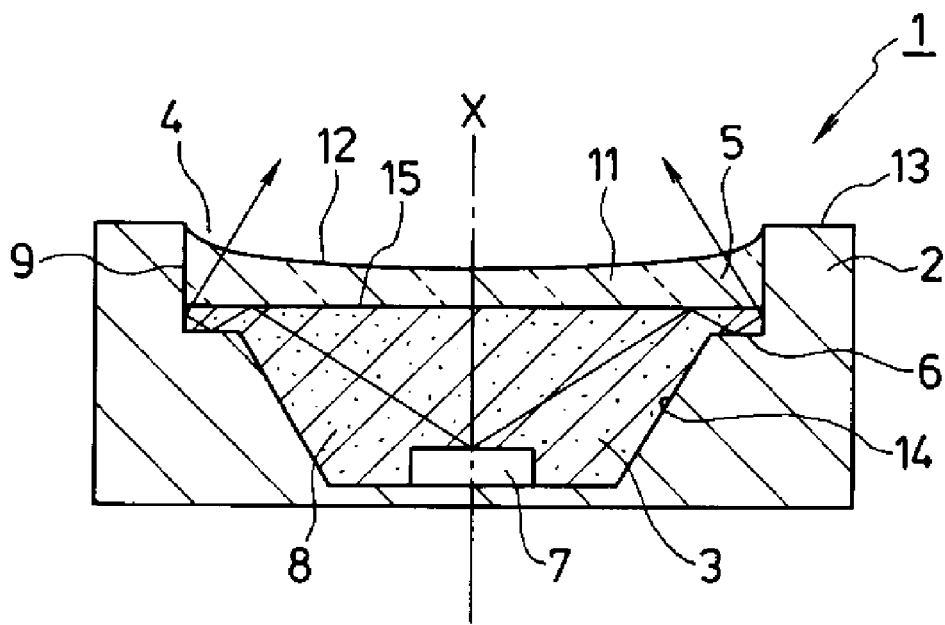
FIG. 6 is a cross sectional view showing a comparative exemplary semiconductor light emitting apparatus.

In the first to third exemplary embodiments as described above, the first resin 8 is charged into the first recessed portion 3 and extends along from the first recessed portion 3 up to the inner surface 9 of the second recessed portion 5 so as to cover the inner surface 9 of the second recessed portion 5. Accordingly, the upper surface 15 of the first resin 8 has a concave curved surface facing away from the below-positioned semiconductor light emitting device 7. The present inventors have examined a comparative exemplary semiconductor light emitting device as shown in FIG. 6 where the upper surface of the first resin is formed flat. In this case, the first resin 8 does not extend along the inner surface 9 of the second recessed portion 5, and accordingly, the second resin 11 charged in the second recessed portion 5 can be in contact with the inner surface 9 of the second recessed portion 5. As a result, the second resin 11 may receive external force due to the expansion and contraction of the first resin 8 so as to be detached and/or peeled from the inner surface 9 of the second recessed portion 5.

With regard to the optical disadvantages, some of the light rays emitted from the semiconductor light emitting device 7 reach the upper surface 15 of the first resin 8 near the inner surface 9. Then, the light rays may be reflected by the upper surface 15 and reach the stepped area 6 between the first recessed portion 3 and the second recessed portion 5. The light rays are reflected again by the stepped area 6 toward the upper surface 15 of the first resin 8 to enter the second resin 11. During the repeated reflection, the light rays passing near the stepped area 6 where the wavelength converting material is deposited can excite the wavelength converting material. As a result, the light rays that are emitted can include the wavelength converted light rays and can enter the second resin 11 from the surface 15 of the first resin 8 near the stepped area 6 as illuminated light rays which have a different color tone as compared to the color tone of light rays radiated from other areas. Accordingly, the light emitted from the semiconductor light emitting apparatus 1 may have color unevenness over the entire surface.

On the contrary, the first to third exemplary embodiments are configured such that the center lowermost level 10 of the curved surface 15 of the first resin 8 is positioned lower than the level of the stepped area 6. When the light rays are emitted from the semiconductor light emitting device 7, they can enter the second resin 11 while not passing through the stepped area 6 where the wavelength converting material may be deposited. Accordingly, a semiconductor light emitting apparatus with less color unevenness can be achieved.

As described above, the semiconductor light emitting apparatus can be configured to include a housing having an inner space composed of a first recessed portion and a second recessed portion provided above the first recessed portion, in which a semiconductor light emitting device is mounted on the bottom surface of the first recessed portion. Here, a first resin composed of a transparent resin material and a phosphor is charged into the first recessed portion to seal the semiconductor light emitting device. Furthermore, the charged first resin is located such that it extends along from an inner surface of the first recessed portion up to an inner surface of the second recessed portion to cover the inner surface of the second recessed portion.

The upper surface of the first resin is recessed at its center area toward the semiconductor light emitting device to form a curved upper surface which is concave facing away from the semiconductor light emitting device. The second resin is charged onto the thus formed first resin. As a result the first resin can cover the entire surface of the first recessed portion and the second recessed portion of the housing, thereby preventing the second resin from being in contact with the inner surface portions of the housing.

According to this configuration, the resin portion (including the first resin and the second resin) charged into the housing is prevented from being detached and/or peeled from the housing, and a reliable semiconductor light emitting apparatus with less color unevenness can be achieved.

The transparent resin material constituting the first resin is selected so as to have at least a particular elasticity. Accordingly, when the second resin has the same level of elasticity as the first resin, or even when the second resin has a certain hardness, it is possible to suppress the generation of stress due to heat generation within the sealing resin for sealing the semiconductor light emitting device 7. This can also suppress crack generation, thereby improving the reliability of the semiconductor light emitting apparatus 1.

When the housing is made of a metal material, a corrosion resistance film made of gold can be provided at least on the outer surface of the housing. This film can prevent the outer surface of the housing from being corroded or deteriorating in color due to the oxidation of the housing material.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A semiconductor light emitting apparatus having an optical axis extending in a light emitting direction comprising:
    a housing having an inner space;
    a semiconductor light emitting device located in the inner space of the housing; and
    a resin portion located in the inner space of the housing, wherein
    the inner space of the housing includes a first recessed portion having a bottom surface and a second recessed portion having an opening, the semiconductor light emitting device being located adjacent to the bottom surface of the first recessed portion, the second recessed portion being continuously formed above the first recessed portion such that the first recessed portion is located between the semiconductor light emitting device and the second recessed portion,
    wherein an upper portion of the first recessed portion and a lower portion of the second recessed portion forms a boundary portion, and the second recessed portion is larger in width than a width of the first recessed portion to form a stepped area at the boundary portion,
    wherein the resin portion includes a first resin and a second resin, the first resin being formed of a transparent resin material mixed with a wavelength converting material, the first resin located in the first recessed portion and configured to seal the semiconductor light emitting device, the second resin being formed of a transparent resin material and located above the first resin such that the first resin is located between the semiconductor light emitting device and the second resin,
    wherein the first resin is configured such that the first resin extends from an inner surface of the first recessed portion up to an inner surface of the second recessed portion to substantially cover the inner surface of the second recessed portion, and the first resin is recessed at its center area toward the semiconductor light emitting device to form a curved upper surface; and
    wherein the second resin is not in contact with both the inner surface of the first recessed portion and the inner surface of the second recessed portion,
    wherein the first resin has a lowermost level of the curved upper surface positioned nearer the semiconductor light emitting device than a lowermost level of the stepped area, such that an imaginary plane that is perpendicular to the optical axis and that intersects at least a point on the lowermost level of the curved upper surface located closest to the semiconductor light emitting device in the light emitting direction is closer to the semiconductor light emitting device than a second imaginary plane that is perpendicular to the optical axis and that intersects at least a point of the lowermost level of the stepped area located closest to the semiconductor light emitting device in the light emitting direction; and
    wherein the second resin has a curved lower surface, and the curved upper surface of the first resin and the curved lower surface of the second resin are matched to each other.

2. The semiconductor light emitting apparatus according to claim 1, wherein the second resin has a curved upper surface recessed toward the semiconductor light emitting device, with an uppermost level of the curved surface of the second resin located, in the light emitting direction, within an uppermost edge of an outer periphery of the second recessed portion of the housing.

3. The semiconductor light emitting apparatus according to claim 1, wherein the second resin has a curved convex upper surface.

4. The semiconductor light emitting apparatus according to claim 1, wherein the second resin has a predetermined hardness harder than a hardness of the transparent resin material constituting the first resin.

5. The semiconductor light emitting apparatus according to claim 1, wherein the transparent resin material constituting the first resin has a predetermined elasticity, and is more elastic than the second resin.

6. The semiconductor light emitting apparatus according to claim 1, wherein the second resin has a refractive index lower than a refractive index of the transparent resin material constituting the first resin.

7. The semiconductor light emitting apparatus according to claim 1, wherein the first recessed portion of the housing is provided with a high reflective film on an inner surface thereof and with a corrosion resistance film on an outer surface thereof.

8. The semiconductor light emitting apparatus according to claim 1, wherein the second resin contains a wavelength converting material in a concentration less than a concentration of wavelength converting material in the first resin.

9. The semiconductor light emitting apparatus according to claim 2, wherein the second resin has a predetermined hardness harder than a hardness of the transparent resin material constituting the first resin.

10. The semiconductor light emitting apparatus according to claim 3, wherein an uppermost level of the curved convex upper surface of the second resin is lower than an uppermost edge of an outer periphery of the second recessed portion of the housing, in the light emitting direction.

11. The semiconductor light emitting apparatus according to claim 3, wherein the second resin has a predetermined hardness harder than a hardness of the transparent resin material constituting the first resin.

12. The semiconductor light emitting apparatus according to claim 4, wherein the transparent resin material constituting the first resin has a predetermined elasticity, and is more elastic than the second resin.

13. The semiconductor light emitting apparatus according to claim 11, wherein the transparent resin material constituting the first resin has a predetermined elasticity, and is more elastic than the second resin.

14. The semiconductor light emitting apparatus according to claim 7, wherein the high reflective film is formed of a film selected from the group consisting of silver, silver alloys, and aluminum, and the corrosion resistance film is formed of gold.

15. A semiconductor light emitting apparatus having an optical axis extending in a light emitting direction comprising:
- a housing defining a first recessed portion having a bottom surface and a second recessed portion having an opening, a width of the first recessed portion taken along a first direction perpendicular to the optical axis is less than a width of the second recessed portion taken along the first direction perpendicular to the optical axis, the second recessed portion being separated from the first recessed portion by a stepped portion of an inner surface of the housing, the stepped portion includes a portion of the inner surface of the housing that extends at an angle that is different with respect to an angle of extension of an adjacent inner surface of the second recessed portion of the housing and different from an angle of extension of an adjacent inner surface of the first recessed portion of the housing;
- a semiconductor light emitting device located adjacent the bottom surface of the first recessed portion of the housing;
- a first resin portion having a lower surface adjacent the semiconductor light emitting device and an upper surface opposed to the lower surface and located further in the light emitting direction than the lower surface the first resin being mixed with a wavelength converting material;
- a second resin located in the housing and including a lower surface located adjacent the upper surface of the first resin portion and an upper surface opposed to the lower surface and located further in the light emitting direction than the lower surface of the second resin; wherein
- the first resin is recessed at its center area toward the semiconductor light emitting device to form a concavely curved upper surface,
- wherein the second resin portion is spaced from and totally separated from the inner surface of the second recessed portion,
- wherein a lowermost level of the curved upper surface of the first resin in the light emitting direction is positioned nearer the semiconductor light emitting device than a lowermost level of the stepped portion in the light emitting direction, such that an imaginary plane that is perpendicular to the optical axis and that intersects tangentially with the lowermost level of the curved upper surface located closest to the semiconductor light emitting device in the light emitting direction is closer to the semiconductor light emitting device than a second imaginary plane that is perpendicular to the optical axis and that intersects with the lowermost level of the stepped portion located closest to the semiconductor light emitting device in the light emitting direction; and
- wherein the second resin has a curved lower surface, and the curved upper surface of the first resin and the curved lower surface of the second resin are matched to each other.

16. The semiconductor light emitting apparatus according to claim 15, wherein the second resin has a curved upper surface recessed toward the semiconductor light emitting device, with an uppermost portion in the light emitting direction of the curved surface of the second resin located within an uppermost edge in the light emitting direction of an outer periphery of the second recessed portion of the housing, such that an imaginary plane that is perpendicular with the optical axis and that intersects the uppermost portion of the curved surface in the light emitting direction of the second resin is located closer to the semiconductor device than a second imaginary plane that is perpendicular with the optical axis and that intersects the uppermost surface in the light emitting direction of the second recessed portion.

17. The semiconductor light emitting apparatus according to claim 15, wherein the first resin covers a substantial portion of the inner surface of the second recessed portion.

\* \* \* \* \*